United States Patent
Popp

(10) Patent No.: US 9,048,244 B2
(45) Date of Patent: Jun. 2, 2015

(54) METHOD FOR MANUFACTURING A MARKED SINGLE-CRYSTALLINE SUBSTRATE AND SEMICONDUCTOR DEVICE WITH MARKING

(71) Applicant: Infineon Technologies AG, Neubiberg (DE)

(72) Inventor: Thomas Popp, Falkenstein (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/515,277

(22) Filed: Oct. 15, 2014

(65) Prior Publication Data

US 2015/0037964 A1     Feb. 5, 2015

Related U.S. Application Data

(62) Division of application No. 13/936,018, filed on Jul. 5, 2013, now Pat. No. 8,901,715.

(51) Int. Cl.
| | |
|---|---|
| *H01L 23/544* | (2006.01) |
| *H01L 21/02* | (2006.01) |
| *H01L 29/66* | (2006.01) |
| *H01L 21/3205* | (2006.01) |

(52) U.S. Cl.
CPC ........ *H01L 23/544* (2013.01); *H01L 21/02532* (2013.01); *H01L 21/0254* (2013.01); *H01L 21/32051* (2013.01); *H01L 29/6609* (2013.01); *H01L 2223/54406* (2013.01); *H01L 2223/54413* (2013.01); *H01L 2223/5442* (2013.01)

(58) Field of Classification Search
CPC ..................................................... H01L 21/768
USPC ................... 438/478; 257/499, 622, E27.001
See application file for complete search history.

(56) References Cited

U.S. PATENT DOCUMENTS

| | | | |
|---|---|---|---|
| 2009/0130830 A1* | 5/2009 | Narita | ............................ 438/507 |
| 2012/0019764 A1 | 1/2012 | Yamazaki | |
| 2012/0286321 A1 | 11/2012 | Galy et al. | |
| 2014/0147971 A1 | 5/2014 | Yokosawa | |
| 2014/0151705 A1 | 6/2014 | Xiao et al. | |
| 2014/0264761 A1* | 9/2014 | Sik et al. | ......................... 257/618 |

* cited by examiner

*Primary Examiner* — Mamadou Diallo
(74) *Attorney, Agent, or Firm* — Slater & Matsil, L.L.P.

(57) ABSTRACT

A method for manufacturing a marked single-crystalline substrate comprises providing a single-crystalline substrate comprising a first material, the single-crystalline substrate having a surface area; forming a marking structure on the surface area of the single-crystalline substrate, wherein the marking structure comprises a first semiconductor material; and depositing a semiconductor layer on the marking structure and at least partially on the surface area of the single-crystalline substrate, wherein the semiconductor layer comprises the second semiconductor material, and wherein the marking structure is buried under the second semiconductor material.

12 Claims, 4 Drawing Sheets

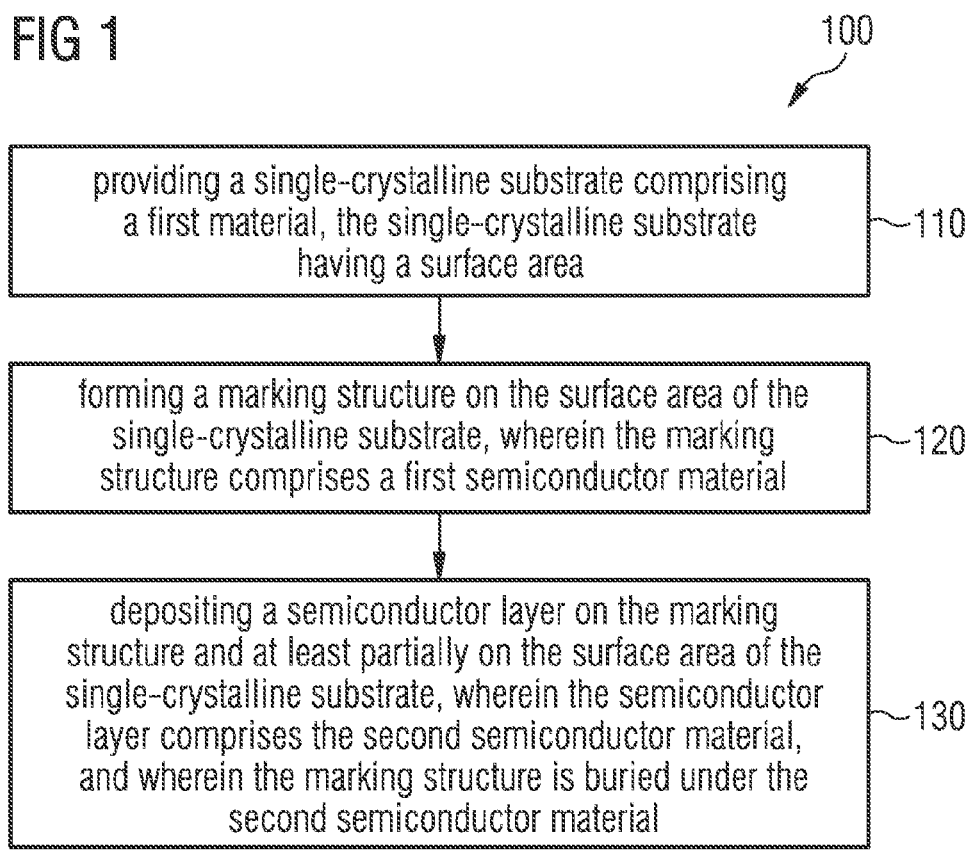

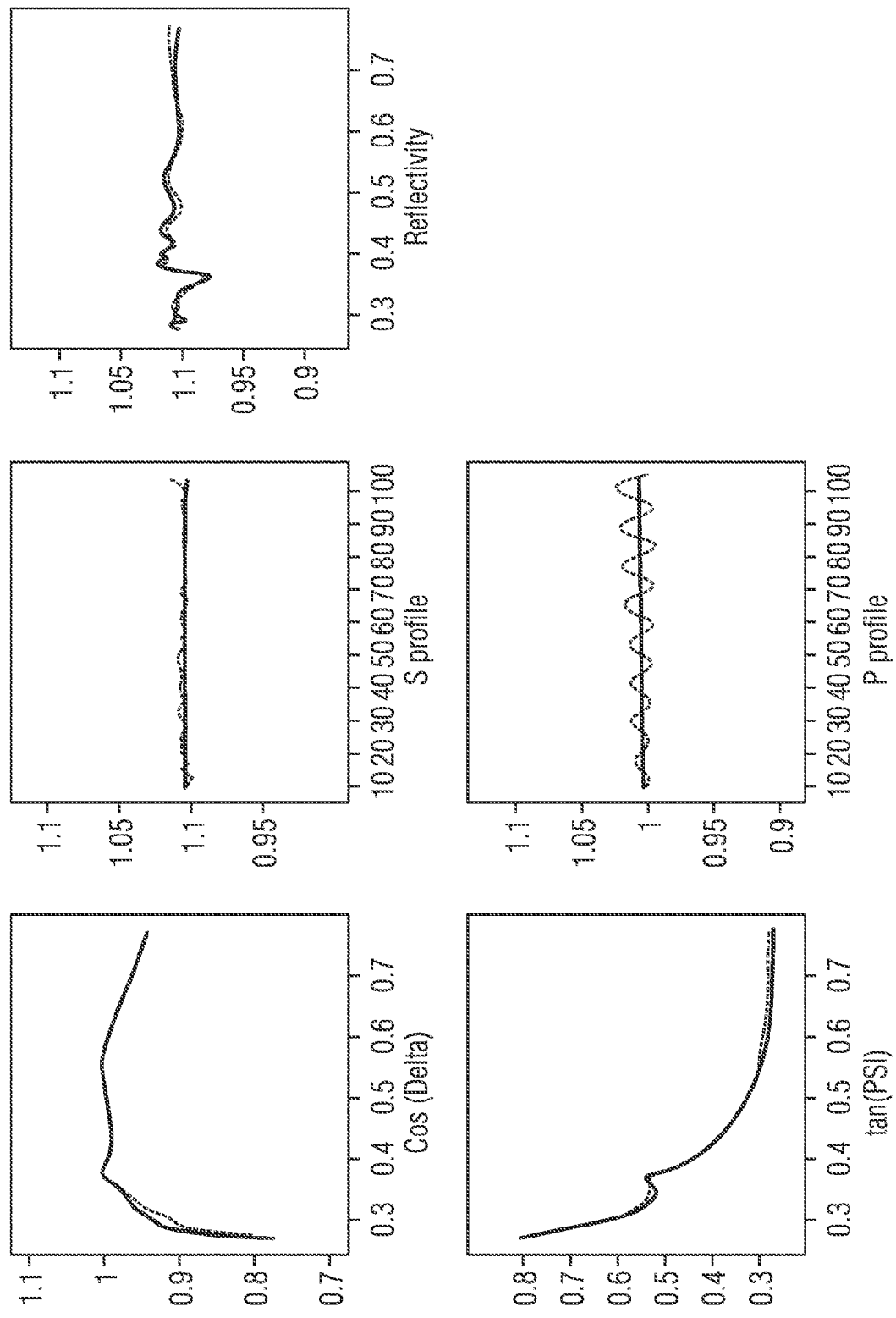

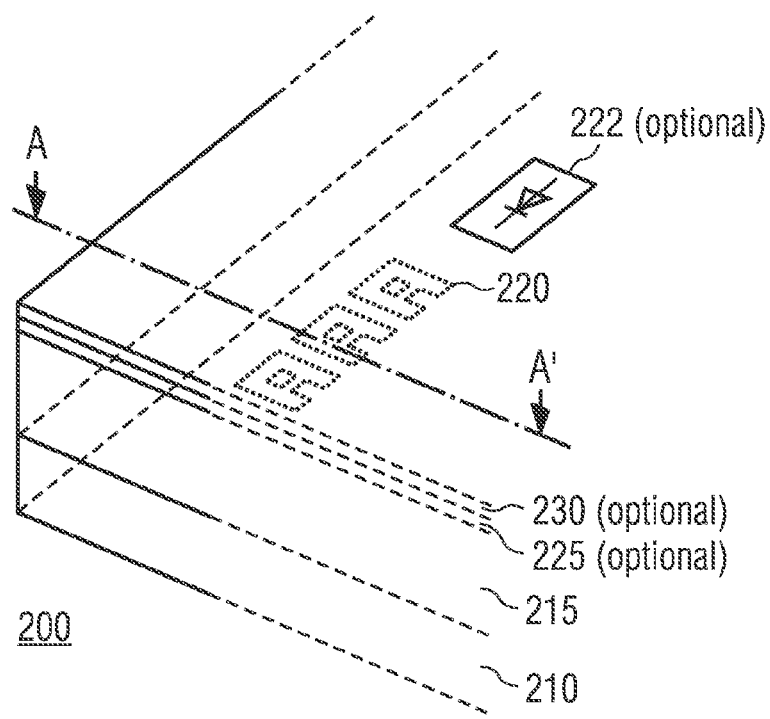
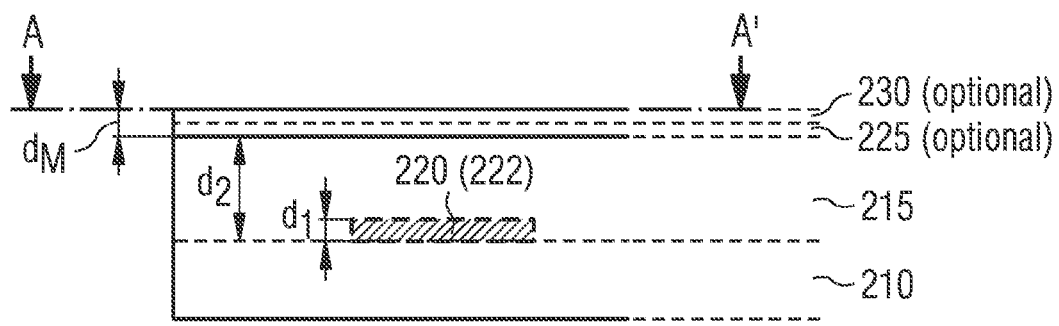

METHOD FOR MANUFACTURING A MARKED SINGLE-CRYSTALLINE SUBSTRATE AND SEMICONDUCTOR DEVICE WITH MARKING

This is a divisional application of U.S. application Ser. No. 13/936,018, entitled "Method for Manufacturing a Marked Single-Crystalline Substrate and Semiconductor Device with Marking" which was filed on Jul. 5, 2013 and is incorporated herein by reference.

TECHNICAL FIELD

Embodiments of the present invention relate to a method for manufacturing a marked or watermarked single-crystalline substrate for an integrated circuit or a semiconductor chip and to a marked single-crystalline substrate having an invisible marking or watermarking in form of a structured semiconductor layer buried under a further semiconductor layer in order to prevent falsified clones of integrated circuits.

BACKGROUND

In the field of integrated circuits there are several cases where integrated circuits are cloned by unauthorized companies. However, cloned integrated circuits (ICs or chips) have in many cases an inferior quality and therefore a reduced reliability with respect to their operational characteristics. Thus, the utilization of cloned integrated circuits having a minor quality can lead to a reduced confidence at the customer side when those chips fail due to their inferior reliability and can have a negative impact on the sales volume of the manufacturer or provider.

Currently, visible logos are placed on the chip and its package. Furthermore, serial numbers on the chips are used to track deliveries. These measures are effective, but such marks can be relatively easily reproduced.

SUMMARY OF THE INVENTION

Embodiments of the present invention relate to a method for manufacturing a marked single-crystalline substrate, e.g. comprising a single-crystalline semiconductor material or a single-crystalline sapphire material. The method comprises providing a single-crystalline substrate comprising a single-crystalline material, the single-crystalline substrate having a surface area; forming a marking structure on the surface area of the single-crystalline substrate, wherein the marking structure comprises a first semiconductor material; and depositing a semiconductor layer on the marking structure and at least partially on the surface area of the semiconductor substrate, wherein the semiconductor layer comprises a second semiconductor material, wherein the marking structure is buried under the second semiconductor material.

Another embodiment provides a marked semiconductor device that comprises a single-crystalline substrate, the single-crystalline substrate comprising a single-crystalline material, and a marking structure on the single-crystalline substrate that is buried under a covering semiconductor layer. The marking structure is a structured layer comprised of a first semiconductor material buried under a second semiconductor material of the covering second semiconductor layer.

In an embodiment, the lattice mismatch of the first and second semiconductor materials is less than 10% (or less than 6%), i.e. the difference of the lattice constants of the first and second semiconductor materials is less than 10% (or less than 6%).

BRIEF DESCRIPTION OF THE DRAWINGS

Embodiments of the present invention will subsequently be discussed referring to the enclosed figures in which:

FIG. 1 shows a schematic flow diagram of a method for marking a single-crystalline substrate according to an embodiment;

FIG. 2a-b show exemplary absorption coefficients of Si and SiGe and an exemplary reflection spectrum of a SiGe/Si stack using SiGe ellipsometry and reflectometry according to an embodiment;

FIG. 3a shows a schematic top view of a semiconductor device with the single-crystalline substrate having a marking thereon according to an embodiment; and FIG. 3b shows a schematic cross-sectional view of a semiconductor device with the single-crystalline substrate having a marking thereon according to an embodiment.

DETAILED DESCRIPTION OF ILLUSTRATIVE EMBODIMENTS

Figure 2A:
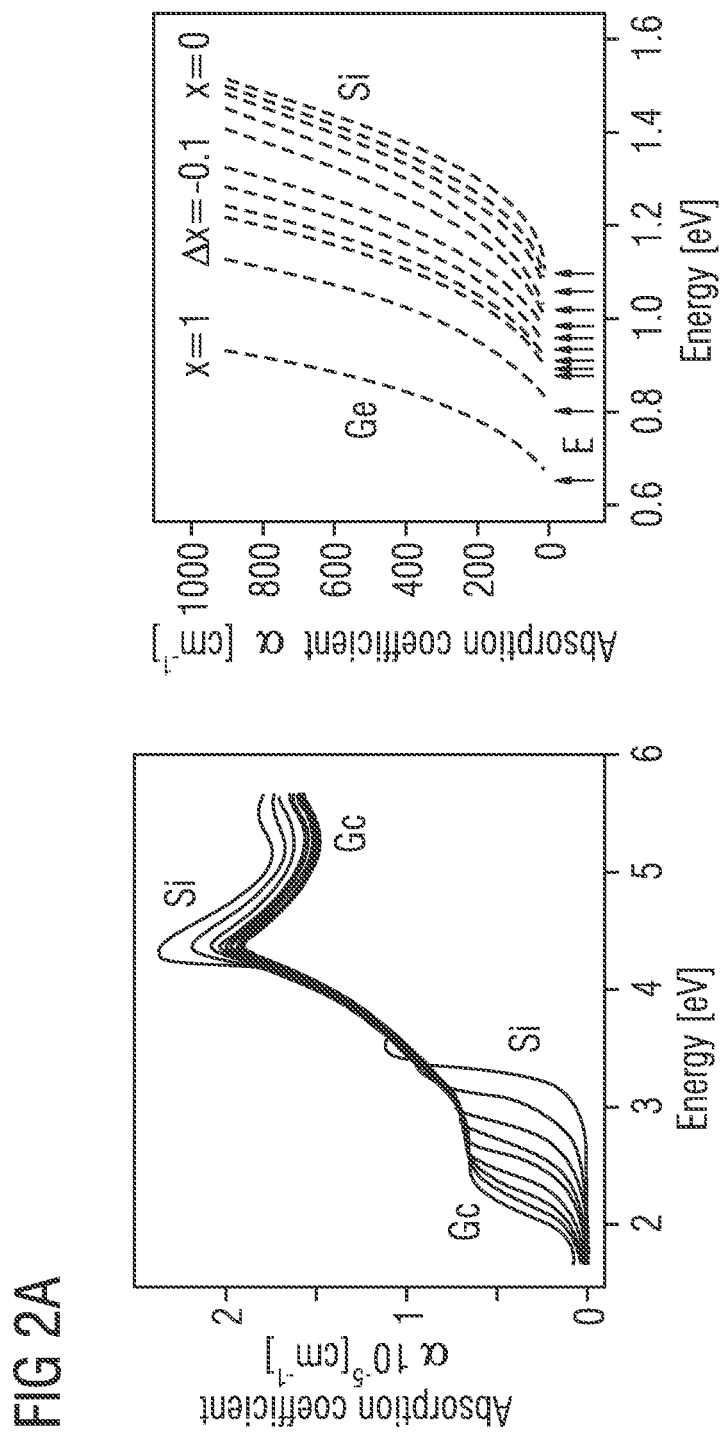

Before embodiments of the present invention will be described in more detail, it is to be pointed out that same, similar or identical elements having the same, similar or identical functionality are provided with the same reference numbers so that elements referred to by identical reference numbers within the different embodiments are interchangeable and the description thereof is mutually applicable.

FIG. 1 shows a method 100 for manufacturing a marked (watermarked or labeled) single-crystalline substrate according to an embodiment of the present invention. The single-crystalline substrate may comprise a single-crystalline semiconductor material or a single-crystalline sapphire material.

According to the method 100 for manufacturing a marked single-crystalline substrate, a single-crystalline substrate comprising a first single-crystalline material is provided 110. The single-crystalline substrate has a surface area, and the surface area of the single-crystalline substrate may be regarded as a main surface of the single-crystalline substrate on which essentially the semiconductor processing is performed. Thus, the surface area may form a processing surface of the single-crystalline substrate.

A marking structure is formed 120 on a marking region of the surface area of the single-crystalline substrate, i.e. on a region of the surface area that is intended to comprise the marking structure of the single-crystalline substrate. The marking structure is formed as a structured semiconductor layer and comprises a first semiconductor material.

Forming the structured layer may comprise (e.g. epitaxially) depositing or growing 120-1 a thin material layer having a first semiconductor material with a first thickness $d_1$ on the marking region of the surface area of the single-crystalline substrate, and (e.g. photolithographically) structuring 120-2 the thin material layer for providing the marking structure in the form of the structured, thin material layer.

Thereafter, a second semiconductor layer is deposited on the marking structure and at least partially or completely on the (remaining) surface area of the single-crystalline substrate. The second semiconductor layer comprises a second semiconductor material. Thus, the marking structure (i.e. the structured layer of the first semiconductor material) is located under this covering semiconductor layer and, thus, buried under the second semiconductor material.

In an example, the single-crystalline substrate also comprises the second semiconductor material, and the structured semiconductor layer comprising the first semiconductor material is located under this covering semiconductor layer and, thus, is buried "in" the second semiconductor material (i.e. in the resulting semiconductor substrate).

In a further example, the single-crystalline substrate and the covering semiconductor layer comprise different single-crystalline materials, and the structured semiconductor layer comprising the first semiconductor material is located between the single-crystalline substrate and the covering semiconductor layer and, thus, buried "under" the second semiconductor material. The single-crystalline substrate may comprise a single-crystalline sapphire material, for example.

The lattice constants of the first semiconductor material and the second semiconductor material are chosen for obtaining a lattice mismatch of the first and second semiconductor materials which is less than 10% (or 6%), i.e. the difference of the lattice constants of the first and second semiconductor materials is less than 10% (or 6%). For example, silicon (Si) has a lattice constant $a_{Si}$ of 5,43095 Å at 300K, and germanium (Ge) has a lattice constant $a_{Ge}$ which is 4.2% higher than the lattice constant $a_{Si}$ of silicon ($a_{Ge}$=1,042 $a_{Si}$). The lattice constant $a_{SiGe}$ of SiGe material can be chosen on the basis of the ratio between Si and Ge in the SiGe material, i.e. on the proportion of Ge in the SiGe material. Thus, the lattice constant $a_{SiGe}$ is between $a_{Si}$ and $a_{Ge}$ (i.e. $a_{Si} \leq a_{SiGe} \leq a_{Ge}$).

The single-crystalline substrate and the second semiconductor layer may comprise silicon (Si) as the second semiconductor material, wherein the structured layer may comprise SiGe or SiGeSn as the first semiconductor material. The SiGe-material may have a Ge (germanium) content of 1 to 35% or the SiGeSn-material may have a tin (Sn) content below 10% (e.g. between 1 to 10%). The addition of Sn material to an SiGe alloy allows to independently adjust the lattice constant and the band gap of the resulting SiGeSn material.

When incorporating Sn as an additional element into the SiGe material, the resulting mismatch of the lattice constants is to be considered. Thus, for example a SiGeSn compound can be utilized, wherein SnD4 may be necessary for a CVD process (D for Deuterium).

Alternatively, the single-crystalline substrate material may comprise GaN or Sapphire ($Al_2O_3$). The first semiconductor material may comprise GaAlN, wherein the second semiconductor material may comprise GaN.

Thus, the single-crystalline substrate material may comprise, for example, a sapphire material as substrate material for a GaN/GaAlN stack. GaN can be used as the second semiconductor material for the covering layer due to its large band gap, wherein GaAlN can be used as the first semiconductor material (e.g. alternatingly) in a layered stack with GaN. A GaAlN layer may function as an adaption layer between two GaN layers.

Moreover, the first semiconductor material of the marking structure may have a thickness $d_1$ of at least 2 nm (or between 2 nm and 1000 nm). The second semiconductor material of the second semiconductor layer, which covers the marking structure and (at least partially or completely) the surface area of the single-crystalline substrate, may have a thickness $d_2$ less than 1000 nm (or between 10 nm and 1000 nm).

It should be clear in the present context that other materials can be utilized for the first semiconductor material and the second semiconductor material insofar as the lattice mismatch of the utilized semiconductor materials is within a predefined range and a semiconductor stack comprised of the first semiconductor material and the second semiconductor material can be procedurally realized by means of semiconductor processing techniques. Moreover, the feasible ranges for the respective thicknesses of the first and second semiconductor layers may depend on the specific materials and proportions (fractions) of the material compounds used for the first and second semiconductor materials, respectively.

To be more specific, epitaxial depositing steps may result in mechanical stress and displacements in the material of the epitaxially grown semiconductor layers depending on the deposit thicknesses and on the specific materials and material compounds for the semiconductor layers. The mechanical stress and the displacements in the material of the epitaxially grown semiconductor layers may increase with increased deposit thicknesses.

As indicated above, the SiGe-material of a Si/SiGe stack may have a Ge (germanium) content of 1% to 35% (or 4% to 30%), wherein the possible ranges for the layer thicknesses of the SiGe/Si stack depend on the specific Ge content. Generally, it can be assumed that with an increasing Ge content in the SiGe material the feasible thickness of the (structured) SiGe layer of the SiGe/Si stack decreases. For example, assuming a Ge content of 4%, the thickness $d_1$ of the first layer can be chosen up to approximately 1000 nm (or between 2 and 1000 nm), and the thickness $d_2$ of the second layer can be chosen between 100 and 1000 nm). Assuming a Ge content of 25%, the thickness $d_1$ of the first layer can be chosen up to approximately 100 nm (or between 2 and 100 nm), and the thickness $d_2$ of the second layer can be chosen up to several µm (e.g. up to 5 µm).

Before, during and/or after performing the method steps for manufacturing a marked semiconductor substrate, circuit elements may be formed in the first semiconductor material of the semiconductor substrate or the semiconductor layer, wherein the marking structure may be without electrical functionality for the circuit elements.

Thus, the marking structure may form a label or a so called watermark for the semiconductor chip (device) and may comprise a (company) logo, a code, a barcode, a sign or a sequence of signs (alphanumeric signs), a text or any combination thereof. The marking structure may indicate any fabrication details, e.g. manufacturer, manufacturing location, manufacturing date, serial number, batch, lot or charge number, etc. or any combination thereof.

Additionally or alternatively to the above described marking structure in form of a label, the marking structure may also comprise a diode (e.g. a pn junction) which is accessible to the outside by means of contact elements. The characteristic line of the diode can be read out by an electrical test. Based on the read-out diode characteristics, a falsified clone can be identified by the changed reverse voltage, for example.

To be more specific, a characteristic quantity for evaluating the authenticity of the diode can be the temperature depending leakage current of the diode. Thus, the leakage current can be measured at different temperatures or over a specific temperature range, wherein the measurement results may be compared with specific values of an authentic diode element.

Moreover, measurement values of the reverse voltage or the break-down voltage of the diode may provide characteristics for validating the authenticity of the watermark (implemented as diode element).

The diode can be formed in a diode area (in the marking region) by means of a pn junction between adjacent (interfacing) semiconductor layers or regions. For achieving the pn junction, the interfacing semiconductor regions are accordingly doted in the diode area. Moreover, contact elements (e.g. vias) may be formed to provide electrical access to the diode structure.

To summarize, based on the pure presence of a diode as watermark and on specific measurement values of electrical characteristics of the diode can provide a validation the authenticity of the watermark and, thus, of the semiconductor device.

In the following, an exemplary implementation of the method for manufacturing a marked semiconductor substrate is described on the basis of a silicon material (Si) for the first semiconductor material and an SiGe material (SiGe) for the second semiconductor material.

For providing a mark (e.g. a watermark or label of a company logo—e.g. the Infineon logo) on a semiconductor chip, a thin SiGe layer with a thickness of about 5 nm (e.g. between 2 nm and 1000 nm) with a germanium (Ge) content of 5% (e.g. between 4-35%) is deposited on a silicon (Si) substrate. This deposited SiGe layer is structured photolithographically so that a marking structure (e.g. a sign in the form of the company logo), a code, a barcode, a sign, a sequence of signs (e.g. alphanumeric signs), a text or any combination thereof results which comprises the deposited and structured SiGe-material. Above the marking structure and at least partially or completely on the (remaining) surface area of the silicon substrate, a silicon layer with a thickness greater than 200 nm or between 20 nm to 1000 nm is deposited. The SiGe structure may be placed on a location without metallization of the resulting semiconductor chip.

The reflectivity of the SiGe/Si stack oscillates between several maxima and minima in the visible wavelength range, but differs only slightly from that of a silicon reference, i.e. a reference for a single material (silicon) substrate. In this connection, it is pointed to the reflection spectrum of a SiGe/Si stack as outlined in FIGS. 2a-b.

As several minima appear per (elementary or fundamental) color, and the minima and maxima oscillate above and below the reflectivity of the silicon material (single semiconductor material), essentially no contrast can be seen in either the color or the brightness of white light with the naked eye or in a microscope. A contrast can be seen if for example a narrow interference filter at the wavelength of a maximum (or minimum) is used. On semiconductor chips having silicon as a first semiconductor material, such invisible markings (e.g. watermarks or labels) can be implemented by buried and structured semiconductor layers having a second semiconductor material (e.g. SiGe) below an epitaxial semiconductor layer comprising the first semiconductor material (e.g. silicon). If the thickness of the SiGe layer and the covering Si layer are chosen appropriately, so that displacements (defects) and/or mechanical stress in the respective semiconductor materials can be essentially avoided, the marking structure (or structured layer) buried in the first semiconductor material is (essentially) "invisible" in the white light, but becomes visible under certain wavelengths (e.g. using interference filters) or under x-rays.

In order to allow the buried marking structure to be read out optically, the thickness of the covering (second) semiconductor (e.g. Si) layer can be chosen up to 0.5 μm-1 μm.

In an example, the buried marking structure is to be read out by means of x-rays, the thickness of the covering (second) semiconductor (e.g. Si) layer can be chosen up to several μm (e.g. up to 5 or 10 μm).

To summarize, a buried epitaxial layer comprising a second semiconductor material (e.g. SiGe), which is not an electrical functional layer as in heterobipolar transistors or strained silicon layers, can be used as an invisible mark or code (i.e. watermark, label or logo) that can be read out by colored light (e.g. using an interference filter), UV-light or infrared light, X-rays or polarized light, to identify the authenticity of a semiconductor chip (an integrated circuit, etc.). Thus, any cloned semiconductor chip can be reliably identified in order to prevent fraud, for example, for chips in electronic passports, ID cards, credit cards or any integrated chip in general.

Contrary to watermarks on banknotes, which become easily visible under UV-light, transmitted light and so on, the marking of a semiconductor according to embodiments of the present invention are (highly) fraud resistant as these marks and signs cannot be easily faked or cloned (reproduced) as they become only visible under very specific (radiation exposing) conditions.

According to a further exemplary implementation of the method 100 for manufacturing a marked semiconductor substrate, a metallization layer having a thickness $d_M$ may be deposited above an insulation (e.g. oxide) layer on the covering semiconductor layer (having the second semiconductor material) and at least partially over the marking structure. The metallization layer may comprise aluminum.

According to the further exemplary implementation of the method for manufacturing a marked semiconductor substrate, a buried and structured layer comprised of a second semiconductor material (e.g. a SiGe semiconductor material) under a epitaxy layer comprised of a first semiconductor material (e.g. a silicon material) is used below a metallization, e.g. an aluminum metallization. Thus, a buried SiGe layer under a silicon epitaxy layer may be used below an aluminum metallization. Because of the (essentially) same color of the SiGe/Si stack and the surrounding silicon and the same brightness the marking structure comprised of the SiGe semiconductor material is not visible (see above). Furthermore, the marking structure is partially or completely hidden below/behind the aluminum metallization layer.

However, as the Kα line of aluminum has an energy of 1.4 keV and the Kα line of Ge has an energy of 9.6 keV, the marking structure becomes clearly visible in X-rays, even if the semiconductor substrate is hidden by a casting or the envelope of a passport.

In X-ray spectroscopy Kα emission lines result when an electron transitions to the innermost "K" shell from a 2p orbital of the second or "L" shell.

FIG. 2a shows the optical absorption coefficients of Si and SiGe in the optical (visible) range (eV). FIG. 2b shows the reflection spectrum of a SiGe/Si stack (e.g. at the marking region) using SiGe ellipsometry and reflectometry. The SiGe material has an exemplary Ge content of 5%, wherein the SiGe marking structure is buried under an unstructured Si layer having an exemplary thickness of 159 nm.

The spectra as shown in FIGS. 2a-2b are intended to principally indicate and explain general physical relationships based on specific materials and layer thicknesses. Thus, FIGS. 2a-2b are merely illustrative for the principles of the present invention. It is understood that different layer thicknesses and materials for the different layers can be chosen in accordance to the above description.

Spectroscopic ellipsometry is an optical technique that can be used for material analysis. A light beam is reflected off of the sample of interest, e.g. at the marking region of the marked semiconductor chip. The light beam is then analyzed to see how the sample changed the characteristics of the light beam. Delta (Δ) is the phase difference induced by the reflection. Psi (Ψ) is the ratio of the amplitude diminutions. The desired material information can be extracted through a model-based analysis using equations to describe interaction of light and materials.

FIGS. 3a-b show an exemplary implementation of a semiconductor substrate achieved by the method 100 as shown in FIG. 1.

As shown in FIGS. 3a-b, the marked semiconductor chip 200 comprises a single-crystalline (monochrystalline) substrate 210. The single-crystalline substrate 210 may comprise a semiconductor material (e.g. Si or GaN etc.) or a single-crystalline insulation material (e.g. sapphire). A marking structure 220 is buried under a covering semiconductor 215. The marking structure 220 comprises a first semiconductor material, wherein the covering (second) semiconductor layer 215 comprises a second semiconductor material.

In an example, the single-crystalline substrate 210 comprises the second semiconductor material, the structured semiconductor layer 220 is located under the second semiconductor layer 215 and, thus, is buried "in" the second semiconductor material.

In an example, the single-crystalline substrate 210 and the covering semiconductor layer 215 comprise different single-crystalline materials, the structured semiconductor layer 220 is located between the single-crystalline substrate 210 and the covering semiconductor layer 215 and, thus, buried "under" the second semiconductor material. The single-crystalline substrate 210 may comprise a single-crystalline sapphire material, for example.

The marking structure 220 is a structured layer of a first semiconductor material buried under the second semiconductor material of the second semiconductor layer 215. The lattice mismatch of the first and second semiconductor materials is less than 10%, i.e. the difference of the lattice constants of the first and second semiconductor materials is less than 10%. For example, silicon (Si) has a lattice constant $a_{Si}$ of 5,43095 Å at 300K. Ge has a lattice constant $a_{SiGe}$ which is 4.2% higher than the lattice constant $a_{Si}$ of silicon ($a_{Ge}=1,042\, a_{Si}$).

As the marking structure is essentially "invisible", the marking structure 220 is indicated by dotted lines in FIG. 3a.

The marked semiconductor chip 200 may further comprises a metallization layer 230 above an insulation 225 (e.g. oxide or nitride) layer on the semiconductor substrate 210 and over the marking structure 220, wherein the metallization layer 230 covers at least partially the second semiconductor layer and the marking structure 220. The metallization layer 230 may comprises aluminum.

Additionally or alternatively to the above described marking structure in form of a label, the marking structure 220 may also comprise a diode element 222 (e.g. a pn junction) which is accessible to the outside by means of contact elements.

The first semiconductor material may comprise Si, wherein the second semiconductor material may comprises SiGe or a SiGeSn. In this case, the SiGe-material may have a Ge (germanium) content of up to 30% or the SiGeSn-material has a Sn (tin) content up to 10%.

Alternatively, the single-crystalline substrate material may comprise GaN or Sapphire ($Al_2O_3$). The first semiconductor material may comprise GaAlN, wherein the second semiconductor material may comprise GaN.

As already indicated above, other materials can be utilized for the first semiconductor material and the second semiconductor material insofar as the lattice mismatch of the utilized semiconductor materials is within a predefined range and a semiconductor stack comprised of the first semiconductor material and the second semiconductor material can be procedurally realized by means of semiconductor processing techniques.

In general, the first semiconductor material has a first lattice constant $a_1$, the second semiconductor material has a second lattice constant $a_2$, and the lattice mismatch m is based on $\Delta a/a_2$, wherein $\Delta a$ is $a_1-a_2$. Thus, any semiconductor materials can be utilized which fulfill the above conditions for the lattice constants.

As shown in FIGS. 3a-b, the first semiconductor material has a thickness $d_1$ less than 1000 nm (or between 2 nm and 1000 nm), wherein the second semiconductor material, which covers the marking structure 220 and (at least partially or completely) the surface area of the semiconductor substrate, has a thickness $d_2$ between 20 nm and 1000 nm.

The marked semiconductor chip 200 may further comprise circuit elements (not shown in FIGS. 3a-b) in the first semiconductor material. In general, the marking structure 220 is without electrical functionality for the circuit elements.

Thus, the marking structure 220 may form a label or a so called watermark for the semiconductor chip 200 and may comprise a (company) logo, a code, a barcode, a sign or a sequence of signs (alphanumeric signs), a text or a combination thereof. The marking structure 220 may indicate any manufacturing details, e.g. manufacturer, manufacturing location, manufacturing date, serial number, batch, lot or charge number, etc. or any combination thereof.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

Although each claim only refers back to one single claim, the disclosure also covers any conceivable combination of claims.

What is claimed is:

1. A method for manufacturing a marked single-crystalline substrate, comprising:
   providing a single-crystalline substrate comprising a first material, the single-crystalline substrate having a surface area;
   forming a marking structure on the surface area of the single-crystalline substrate, wherein the marking structure comprises a first semiconductor material; and
   depositing a semiconductor layer on the marking structure and at least partially on the surface area of the single-crystalline substrate, wherein the semiconductor layer comprises a second semiconductor material, and wherein the marking structure is buried under the second semiconductor material.

2. The method according to claim 1, wherein forming the marking structure further comprises:
   depositing a first semiconductor layer comprising the first semiconductor material on a marking region of the surface area of the single-crystalline substrate; and
   structuring the first semiconductor material thereby obtaining a structured semiconductor layer in form of the marking structure.

3. The method according to claim 1, further comprising:
   depositing a metallization layer above an insulation layer on the semiconductor layer and over the marking structure so that the metallization layer covers at least partially the semiconductor layer and the marking structure.

4. The method according to claim 3, wherein the metallization layer comprises aluminum.

5. The method according to claim 3, wherein the marking structure is buried in the second semiconductor material and below the metallization layer.

6. The method according to claim 1, wherein the second semiconductor material comprises silicon, and wherein the first semiconductor material comprises SiGe or SiGeSn.

7. The method according to claim 1, wherein the second semiconductor material comprises GaN and the first semiconductor material comprises GaAlN.

8. The method according to claim 1, wherein a lattice mismatch of the first and second semiconductor materials is less than 10%.

9. The method according to claim 1, wherein the first semiconductor material has a thickness $d_1$ between 2 nm and 1000 nm, and wherein the second semiconductor material, which is deposited on the marking structure and at least partially on the surface area of the single-crystalline substrate, has a thickness $d_2$ between 20 nm and 1000 nm.

10. The method according to claim 1, comprising:
   forming circuit elements in the second semiconductor material, wherein the marking structure is without electrical functionality of the circuit elements.

11. The method according to claim 1, wherein forming the marking structure comprises forming a logo, a code, a barcode, a sign or a sequence of signs, a text or a combination thereof.

12. The method according to claim 1, wherein forming the marking structure comprises forming a buried diode element.

* * * * *